United States Patent [19]
Hershberger

[11] Patent Number: 4,811,264
[45] Date of Patent: Mar. 7, 1989

[54] NUMERICAL PRECORRECTION TECHNIQUE
[75] Inventor: David L. Hershberger, Nevada City, Calif.
[73] Assignee: The Grass Valley Group, Inc., Grass Valley, Calif.
[21] Appl. No.: 64,353
[22] Filed: Jun. 22, 1987
[51] Int. Cl.$^4$ ............................................. G06F 15/35
[52] U.S. Cl. ................................ 364/726; 364/724.01
[58] Field of Search ................ 364/602, 604, 724, 726
[56] References Cited
U.S. PATENT DOCUMENTS
4,106,103  8/1978  Perrault ........................ 364/726 X
4,554,633  11/1985  Glover et al. .................. 364/724 X Primary Examiner—Steven Mottola
Attorney, Agent, or Firm—Francis I. Gray

[57] ABSTRACT

A numerical precorrection technique for modifying a digital signal corresponding to a desired analog signal to compensate for the characteristics of an analog filter which processes the digital signal after it is converted from digital to analog converts the digital signal into its spectral components. The spectral components are corrected according to the corresponding spectral characteristics of the analog filter for both amplitude and phase within the filter pass band and for phase only outside the filter pass band. The resulting corrected spectral components are converted into a corrected digital signal which is used to produce the desired analog signal.

5 Claims, 2 Drawing Sheets

NUMERICAL PRECORRECTION TECHNIQUE

BACKGROUND OF THE INVENTION

The present invention relates to compensation methods, and more particularly to a numerical precorrection technique for compensating digital data in a ROM, which data is converted to analog and passed through an analog filter, for amplitude ripple and group delay characteristics of the analog filter both in band and out of band to improve overshoot and time domain response characteristics.

A digital signal generator uses a read only memory (ROM) to store signal patterns to be reproduced, a digital to analog converter (DAC) to convert the signal patterns to analog, and an anti-aliasing filter to eliminate unwanted frequency components. The filter has certain amplitude ripple and group delay characteristics which can be determined and compensated for in the ROM data. Moreover a zero order hold circuit, commonly associated with the DAC, introduces a sin(x)/x frequency response characteristic. However prior compensation schemes only corrected for in band response, which resulted in time domain distortions at the leading and trailing edges of pulses.

What is desired is a numerical precorrection technique which provides correction out of band as well as in band.

SUMMARY OF THE INVENTION

Accordingly the present invention provides a numerical precorrection technique which corrects digital data to be stored in a ROM for the amplitude ripple and group delay characteristics of an analog filter both within the pass band and for group delay in the transition band. The spectral characteristics of the filter are stored in a filter file, and the digital representation of a desired signal is stored in a signal file. The desired signal is processed by a discrete Fourier transform (DFT) to produce spectral components for the desired signal. Within the pass band the corresponding amplitude and phase components of each spectral component are both corrected. Outside the pass band the corresponding phase components of the filter are corrected for each signal spectral component, the amplitude being held constant. The corrected signal spectral components are then processed by a reverse DFT to produce the precorrected digital data.

The objects, advantages and novel features of the present invention will be apparent from the following detailed description when read in conjunction with the appended claims and attached drawing.

DESCRIPTION OF THE PREFERRED EMBODIMENT

Figure 1:
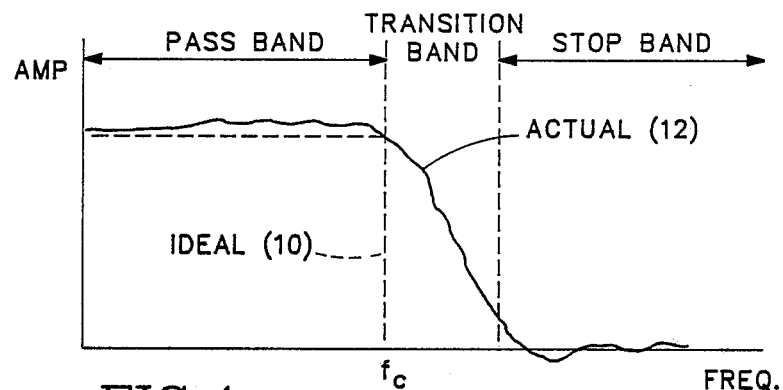
FIG. 1 is a graph for the frequency response of an ideal filter and a real filter.

Referring now to FIG. 1 an ideal filter response 10 is indicated by the dotted line. Throughout the pass band the amplitude is constant, and at the cutoff frequency $f_c$ the amplitude goes immediately to zero. However an actual filter response 12 has an amplitude in the pass band which is not constant and which may contain ripple. Further at the cutoff frequency $f_c$ the amplitude is down by some specified amount, such as 3 dB, from the maximum amplitude and continues to have a significant, but decreasing, value at frequencies above the cutoff frequency. The interval below the cutoff frequency is the pass band, the interval above the cutoff frequency until the amplitude decreases below a defined value is the transition band, and the interval above the transition band is the stop band.

Figure 2:
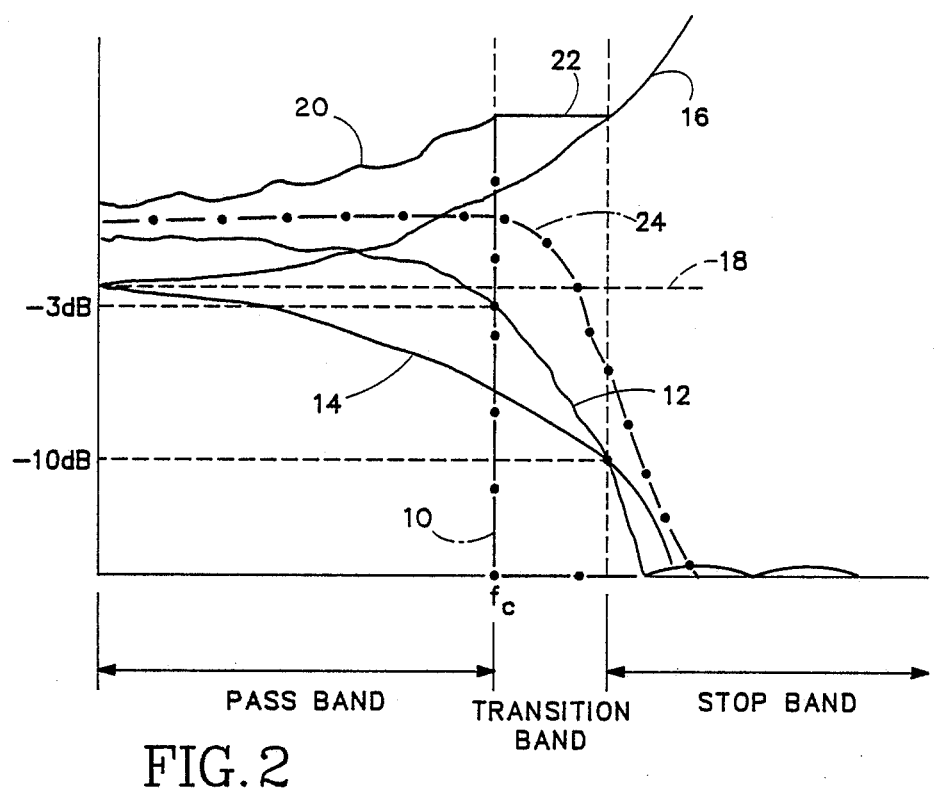
FIG. 2 is a graph illustrating the numerical precorrection technique of the present invention.

Theoretically for a given filter response 14 without ripple applying the inverse response 16 results in a total response 18 which is flat for all frequencies. As shown in FIG. 2, to produce the ideal frequency response 10 from the real frequency response 12 an inverse response 20 with ripple is used up to the cutoff frequency, and then all subsequent frequency components are subjected to a zero response. However, the abrupt cutoff causes ringing which is objectionable, so a more gradual roll off is desired. Therefore, the present numerical precorrection technique applies the inverse correction response 20 up to the cutoff frequency, and then maintains a constant amplitude response 22. The resulting filter response 24 is flat up to the cutoff frequency and then rolls off during the transition band to reduce the ringing problem.

Figure 3:
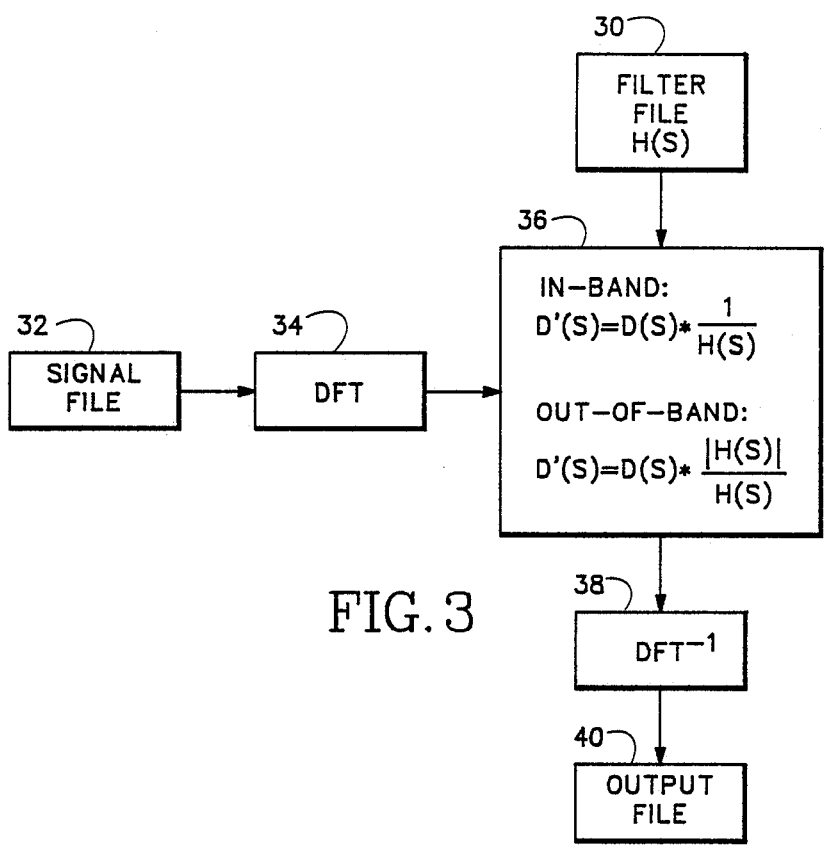
FIG. 3 is a flow chart of the numerical precorrection technique of the present invention.

As shown in FIG. 3 the frequency response data H(s) for a given filter is stored in a filter file 30. The digital data corresponding to an analog signal which is to be reproduced through the given filter is stored in a signal file 32. The digital data is processed by a discrete Fourier transform (DFT) 34 to produce corresponding frequency response data D(s). A frequency domain correction processor 36 multiplies each D(s) with the inverse of the corresponding H(s) in both amplitude and phase up to the cutoff frequency specified for the given filter to produce a corrected D'(s). Above the cutoff frequency each D(s) is multiplied by the phase component of H(s) only to produce the corrected D'(s). The resulting D'(s) is processed by a reverse DFT 38. The precorrected digital data from the reverse DFT 38 is stored in an output file 40. The digital data in the output file 40 is then used to program the ROM which will be used in a digital signal generator to produce the desired analog signal through the given filter.

Thus the present invention provides a numerical precorrection technique for generating precorrected digital data corresponding to a desired analog signal which will be processed by a given filter to improve the overshoot and time domain characteristics of the resulting signal by providing in band and out of band correction, with the out of band correction being phase correction only, the amplitude being unchanged.

What is claimed is:

1. A method for precorrecting digital data corresponding to a desired analog signal processed by an analog filter having a pass band comprising the steps of:

processing a desired digital signal corresponding to the desired analog signal to produce spectral components for the desired digital signal;

correcting each spectral component using a corresponding spectral characteristic of the analog filter for both amplitude and phase within the pass band and for phase only outside the pass band to produce corrected spectral components; and processing the corrected spectral components to produce a corrected desired digital signal which, when converted from digital to analog and processed by the analog filter, provides the desired analog signal.

2. An apparatus for precorrecting digital data corresponding to a desired analog signal processed by an analog filter having a pass band comprising:
   means for converting a desired digital signal corresponding to the desired analog signal into spectral components;
   means for correcting the spectal components with corresponding spectral characteristics for the analog filter in both amplitude and phase within the pass band and in phase only outside the pass band to produce corrected spectral components; and
   means for converting the corrected spectral components into a corrected desired digital signal;
   whereby when the corrected desired digital signal is converted from digital to analog and processed by the analog filter, the desired analog signal is produced.

3. An apparatus as recited in claim 2 wherein the desired digital signal converting means comprises:
   means for storing the desired digital signal; and
   means for processing the desired digital signal from the storing means by a discrete Fourier transform to produce the spectral components.

4. An apparatus as recited in claim 2 wherein the corrected spectral components converting means comprises:
   means for processing the corrected spectral components by a reverse discrete Fourier transform to produce the corrected desired digital signal; and
   means for storing the corrected desired digital signal from the processing means.

5. An apparatus as recited in claim 2 wherein the correcting means comprises:
   means for storing the spectral characteristics of the analog filter; and
   means for processing the spectral characteristics from the storing means with the spectral components according to $D'(s) = D(s) * 1/H(s)$ within the pass band and according to $D'(s) = D(s) * |H(s)|/H(s)$ outside the pass band, where $D'(s)$ is the corrected spectral components, $D(s)$ is the spectral components, and $H(s)$ is the spectral characteristics of the analog filter, to produce the corrected spectral components.

* * * * *